United States Patent
Yong

(10) Patent No.: US 11,353,741 B2
(45) Date of Patent: Jun. 7, 2022

(54) DISPLAY MODULE AND DISPLAY DEVICE

(71) Applicant: TCL CHINA STAR OPTOELECTRONICS TECHNOLOGY CO., LTD., Guangdong (CN)

(72) Inventor: Weina Yong, Shenzhen (CN)

(73) Assignee: TCL CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 202 days.

(21) Appl. No.: 16/764,612

(22) PCT Filed: Apr. 20, 2020

(86) PCT No.: PCT/CN2020/085644
§ 371 (c)(1),
(2) Date: May 15, 2020

(87) PCT Pub. No.: WO2021/203460
PCT Pub. Date: Oct. 14, 2021

(65) Prior Publication Data
US 2022/0113588 A1    Apr. 14, 2022

(30) Foreign Application Priority Data
Apr. 9, 2020 (CN) .......................... 202010275699.8

(51) Int. Cl.
*G02F 1/13357* (2006.01)
*H01L 27/15* (2006.01)
(52) U.S. Cl.
CPC ...... *G02F 1/133603* (2013.01); *H01L 27/156* (2013.01)

(58) Field of Classification Search
CPC ......... G02F 1/133603; G02F 1/133602; G02F 1/133509; G02F 1/133514; G02F 1/133609; G02F 1/133612; H01L 27/156
See application file for complete search history.

(56) References Cited

U.S. PATENT DOCUMENTS

2017/0133818 A1    5/2017  Cok
2018/0188606 A1*   7/2018  Lee ................... G02F 1/133608

FOREIGN PATENT DOCUMENTS

| CN | 101295096 A | 10/2008 |
| CN | 105551444 A | 5/2016 |
| CN | 106094334 A | 11/2016 |
| CN | 206557511 U | 10/2017 |

* cited by examiner

*Primary Examiner* — Joseph L Williams
*Assistant Examiner* — Jose M Diaz
(74) *Attorney, Agent, or Firm* — Benesch, Friedlander, Coplan & Aronoff LLP

(57) ABSTRACT

The present application discloses a display module and a display device. The display module includes: a liquid crystal display panel; a micro light-emitting diode (LED) display panel disposed under the liquid crystal display panel and bonded to the liquid crystal display panel, wherein the micro LED display panel only displays white color; a first driving chip configured to drive the liquid crystal display panel to emit light and display; and a second driving chip configured to drive the micro LED display panel to emit light and display. Power consumption of the display module is reduced, and contrast of a double-layer display panel is significantly increased.

14 Claims, 2 Drawing Sheets

DISPLAY MODULE AND DISPLAY DEVICE

FIELD OF APPLICATION

The present application is related to the field of display, and specifically, to a display module and a display device.

BACKGROUND OF APPLICATION

With development of thin-film transistor liquid crystal displays (TFT-LCDs), introductions of high-end models and customer demands have increased, and increasingly higher requirements have been placed on contrasts of display panels.

In order to realize better contrast performance, some products currently use double-layer panel designs to increase their contrast to 100,000th level, which is much higher than that of ordinary LCD panels with single-layer panel designs, which can only reach thousandth level. A current double-layer panel is composed of two LCD panels. A bottom panel is an LCD with a color resist layer removed, which is configured to control a transmission of a light source of a backlight in partitions, reaches a number of backlight partitions ranging from 1000 w (FHD) to 2000 w (UD), and effectively controls brightness of the backlight. A top panel is a normally designed LCD, which realizes functions of color discrimination and brightness display under a joint action of the backlight and the bottom panel. However, a design of the two LCD panels has limited increase in panel contrast, and a design of the double-layer panel and the backlight increases power consumption of displays.

Therefore, current thin-film transistor liquid crystal displays have a problem of low contrast and need to be improved.

SUMMARY OF APPLICATION

The present application provides a display module and a display device to improve a problem of low contrast in current thin-film transistor liquid crystal displays.

The present application provides a display module including:
a liquid crystal display panel;
a micro light-emitting diode (LED) display panel disposed under the liquid crystal display panel and bonded to the liquid crystal display panel, wherein the micro LED display panel only displays white color;
a first driving chip connected to the liquid crystal display panel and configured to drive the liquid crystal display panel to emit light and display; and
a second driving chip connected to the micro LED display panel and configured to drive the micro LED display panel to emit light and display.

In the display module provided by the present application, the liquid crystal display panel includes pixel units arranged in an array, and each of the pixel units includes three first sub-pixels; and the micro LED display panel includes second sub-pixels arranged in an array.

In the display module provided by the present application, the second sub-pixels and the first sub-pixels are in one-to-one correspondence.

In the display module provided by the present application, the second sub-pixels and the pixel units are in one-to-one correspondence.

In the display module provided by the present application, a structure of bonding the liquid crystal display panel and the micro LED display panel includes bonding a lower surface of the liquid crystal display panel to an upper surface of the micro LED display panel by a transparent adhesive layer.

In the display module provided by the present application, a structure of bonding the liquid crystal display panel and the micro LED display panel includes using a frame adhesive in a non-display region around the liquid crystal display panel for bonding.

In the display module provided by the present application, the micro LED display panel includes a second array substrate and a micro LED pixel array bonded to the second array substrate.

In the display module provided by the present application, the micro LED pixel array includes a substrate, a first semiconductor layer, an active layer, a second semiconductor layer, a first electrode, and a second electrode.

In the display module provided by the present application, material of the active layer includes multi-colored light-emitting mixed material.

Meanwhile, the present application further provides a display device including a display module. The display module includes:
a liquid crystal display panel;
a micro light-emitting diode (LED) display panel disposed under the liquid crystal display panel and bonded to the liquid crystal display panel, wherein the micro LED display panel only displays white color;
a first driving chip connected to the liquid crystal display panel and configured to drive the liquid crystal display panel to emit light and display; and
a second driving chip connected to the micro LED display panel and configured to drive the micro LED display panel to emit light and display.

In the display device provided by the present application, the liquid crystal display panel includes pixel units arranged in an array, and each of the pixel units includes three first sub-pixels; and the micro LED display panel includes second sub-pixels arranged in an array.

In the display device provided by the present application, the second sub-pixels and the first sub-pixels are in one-to-one correspondence.

In the display device provided by the present application, the second sub-pixels and the pixel units are in one-to-one correspondence.

In the display device provided by the present application, a structure of bonding the liquid crystal display panel and the micro LED display panel includes bonding a lower surface of the liquid crystal display panel to an upper surface of the micro LED display panel by a transparent adhesive layer.

In the display device provided by the present application, a structure of bonding the liquid crystal display panel and the micro LED display panel includes using a frame adhesive in a non-display region around the liquid crystal display panel for bonding.

In the display device provided by the present application, the micro LED display panel includes a second array substrate and a micro LED pixel array bonded to the second array substrate.

In the display device provided by the present application, the micro LED pixel array includes a substrate, a first semiconductor layer, an active layer, a second semiconductor layer, a first electrode, and a second electrode.

In the display device provided by the present application, the micro LED pixel array further includes a light-emitting medium layer.

In the display device provided by the present application, material of the active layer includes multi-colored light-emitting mixed material.

The present application provides the display module and the display device. The display module includes: the liquid crystal display panel; the micro LED display panel disposed under the liquid crystal display panel and bonded to the liquid crystal display panel, wherein the micro LED display panel only displays white color; the first driving chip connected to the liquid crystal display panel and configured to drive the liquid crystal display panel to emit light and display; and the second driving chip connected to the micro LED display panel and configured to drive the micro LED display panel to emit light and display. The display module adopts a double-layer panel design of bonding the liquid crystal display panel and the micro LED display panel, which removes a backlight module. The micro LED display panel serves as the backlight module and reduces power consumption of the display module. The micro LED display panel only displays white color. By controlling a light-emitting display of sub-pixels in the micro LED display panel, backlight brightness required for each pixel in the liquid crystal display panel can be finely adjusted to realize a precise distinction of brightness, thereby significantly increasing contrast of a double-layer display panel.

DESCRIPTION OF DRAWINGS

The following describes specific embodiments of the present application in detail with reference to the accompanying drawings, which will make technical solutions and other beneficial effects of the present application obvious.

DETAILED DESCRIPTION OF PREFERRED EMBODIMENTS

In view of a problem of low contrast in a current thin-film transistor liquid crystal display panel, a display module provided by the present application can relieve this problem.

Figure 1:
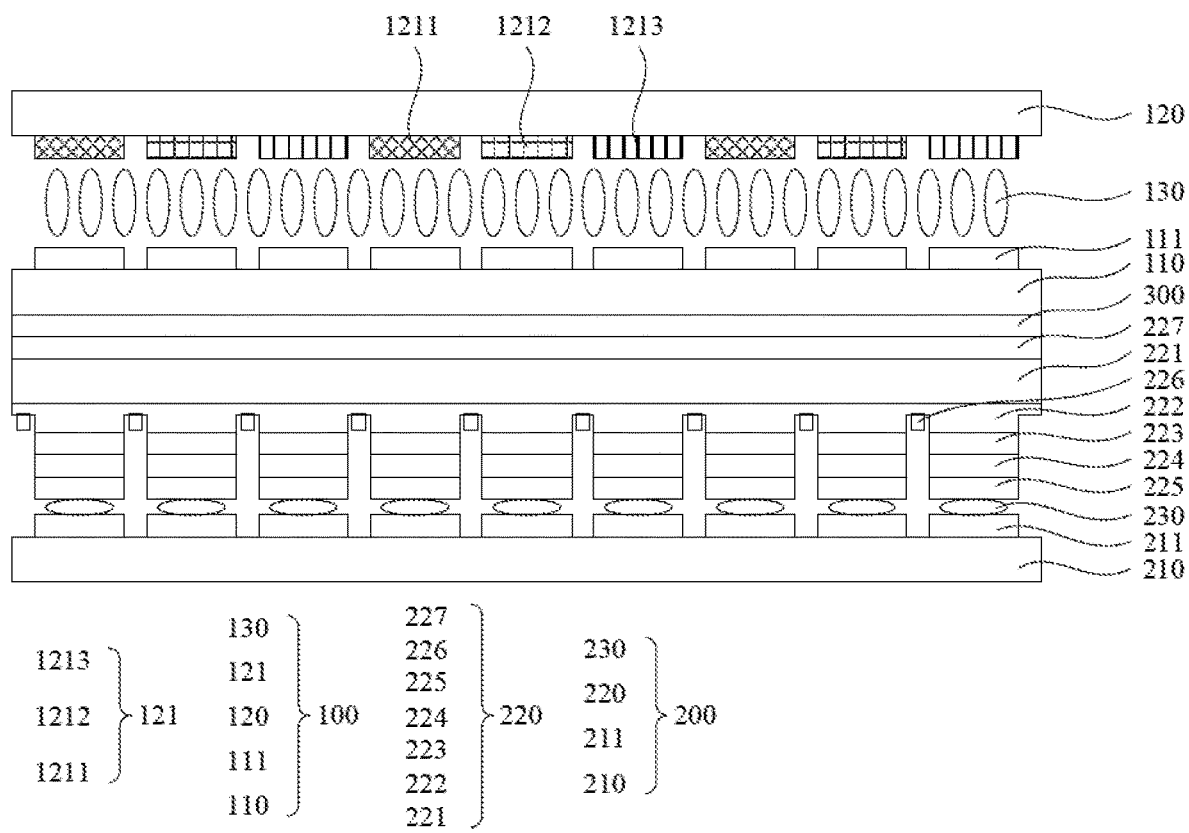
FIG. 1 is a first structural diagram of a display module provided by an embodiment of the present application.
Figure 2:
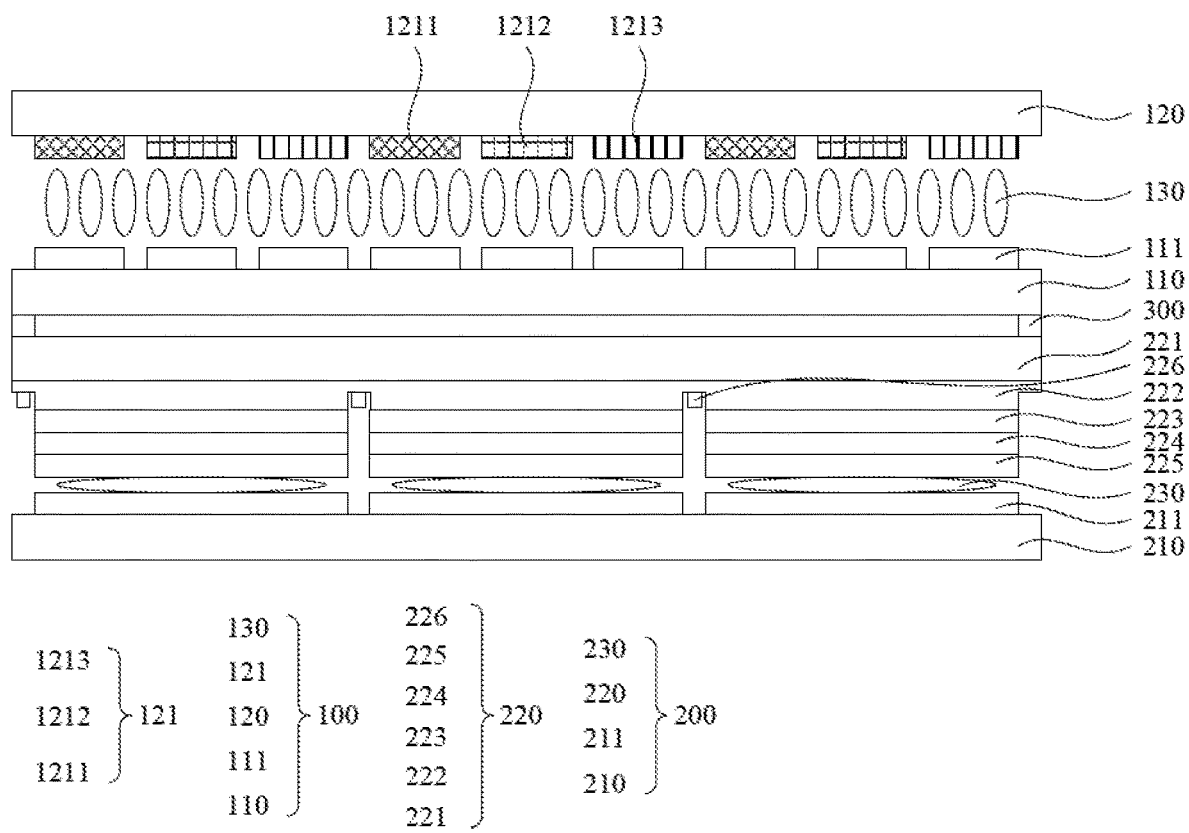
FIG. 2 is a second structural diagram of the display module provided by an embodiment of the present application.

In an embodiment, as shown in FIGS. 1 and 2, a display module provided by the present application includes:

a liquid crystal display panel 100;

a micro light-emitting diode (LED) display panel 200 disposed under the liquid crystal display panel 100 and bonded to the liquid crystal display panel 100, wherein the micro LED display panel 200 only displays white color;

a first driving chip (not shown) connected to the liquid crystal display panel 100 and configured to drive the liquid crystal display panel 100 to emit light and display; and a second driving chip (not shown) connected to the micro LED display panel 200 and configured to drive the micro LED display panel 200 to emit light and display.

This embodiment provides the display module. The display module adopts a double-layer panel design of bonding the liquid crystal display panel and the micro LED display panel, which removes a backlight module. The micro LED display panel serves as the backlight module and reduces power consumption of the display module. The micro LED display panel only displays white color. By controlling alight-emitting display of sub-pixels in the micro LED display panel, backlight brightness required for each pixel in the liquid crystal display panel can be finely adjusted to realize a precise distinction of brightness, thereby significantly increasing contrast of a double-layer display panel and increasing its contrast value to millionth level.

FIGS. 1 and 2 are two structural diagrams of the display module provided by embodiments of the present application. The following describes the display module provided by the embodiments of the present application in further detail with reference to drawings.

The liquid crystal display panel 100 includes a first array substrate 110, a color filter substrate 120, a liquid crystal layer 130 disposed between the first array substrate 110 and the color filter substrate 120, a first polarizer (not shown) disposed on a side of the first array substrate 110, and a second polarizer (not shown) disposed on a side of the color filter substrate 120. The first array substrate 110 is provided with first pixel electrode 111. The color filter substrate 120 is disposed with a color resist layer 121. The color resist layer 121 includes a red color resist 1211, a green color resist 1212, and a blue color resist 1213, which are sequentially arranged in an array. The red color resist 1211, the green color resist 1212, and the blue color resist 1213 correspond one-to-one to the first pixel electrodes 111 to realize driving of the first pixel electrodes 111 to liquid crystals under each color resist. The first driving chip is bonded to the first array substrate 110.

The micro LED display panel 200 includes a second array substrate 210 and a micro LED pixel array 220 bonded to the second array substrate 210. A method of bonding the second array substrate 210 and the micro LED pixel array 220 is soldering a micro LED chip on the second array substrate 210 through a transparent conductive metal layer 230, which realizes an electrical connection between the micro LED chip and a pixel driving circuit in the second array substrate 210 and realizes a transmission of driving signals to the micro LED chip. The second driving chip is bonded to the second array substrate 210.

In an embodiment, as shown in FIG. 1, the micro LED pixel array 220 includes a plurality of micro LED chips arranged in an array. Each of the plurality of micro LED chips includes a substrate 221, a first semiconductor layer 222, an active layer 223, a second semiconductor layer 224, a first electrode 225, and a second electrode 226.

The substrate 221 is configured to support the micro LED chip, which can be a sapphire glass substrate, an intrinsic layer made of a sapphire glass substrate and gallium nitride (GaN) formed on the sapphire substrate near a side of an N-type semiconductor layer 222, or an intrinsic layer of gallium nitride (GaN) after removing the sapphire glass substrate. In another embodiment, the micro LED chip can exclude the substrate, that is, the substrate is removed after the micro LED chip is manufactured.

The first semiconductor layer 222 is formed under the substrate 221. The first semiconductor layer 222 is an N-type gallium nitride (GaN) layer. The N-type gallium nitride (GaN) layer can be a nitride gallium layer doped with silicon (Si). The active layer 223 is formed under the first semiconductor layer 222. The active layer 223 is a gallium nitride (GaN) multiple-quantum well layer. The gallium nitride (GaN) multiple-quantum well layer can be an indium gallium nitride/gallium nitride (InGaN/GaN) layer repeatedly arranged in sequence. The second semiconductor layer 224 is formed under the active layer 223. The second semiconductor layer 224 is a P-type gallium nitride (GaN) layer. The P-type gallium nitride (GaN) layer can be a gallium nitride layer doped with magnesium (Mg).

The first electrode 225 is formed under the second semiconductor layer 224. The first electrode 225 is a P-type electrode. The second array substrate 210 is provided with a second pixel electrode 211. The first electrode 225 is electrically connected to the second pixel electrode 211 through the transparent conductive metal layer 230. The first semiconductor layer 222 includes a protruding stage and an exposed bottom. The active layer 223 is formed on the protruding stage. The second electrode 226 is formed on the exposed bottom and is electrically connected to the first semiconductor layer 222. The second electrode 226 is an N-type electrode. Materials of the first electrode 225 and the second electrode 226 are transparent conductive metals or metal alloys, such as indium tin oxide (ITO), indium zinc oxide (IZO), etc., which can adopt a single-layer metal structure or a multi-layer metal structure.

The N-type semiconductor layer 222, the active layer 223, and the P-type semiconductor layer 224 constitute a light-emitting PN junction. The P-type semiconductor layer 224 is electrically connected to the first electrode 225, and the N-type semiconductor layer 222 is electrically connected to the second electrode 226, so the light-emitting PN junction can be electrically connected to an external circuit, thereby realizing the second driving chip applying a voltage to the light-emitting PN junction. When the second driving chip applies the voltage to the light-emitting PN junction, electrons are generated in the N-type semiconductor layer 222 and injected into the active layer 223, and holes are generated in the P-type semiconductor layer 224 and injected into the active layer 223. The electrons and the holes recombine in the active layer 223 to emit photons to realize conversion of electrical energy to light energy, thereby completing electroluminescence of the micro LED chip.

In this embodiment, the micro LED chip is a blue micro LED chip, and light emitted by the light-emitting PN junction is blue light. In order to realize that the micro LED only displays white color, it is necessary to provide a light-emitting medium layer 227 inside or outside the micro LED chip to convert the blue light emitted by the light-emitting PN junction into white light. Material of the light-emitting medium layer 227 is a yellow light material, and can be at least one of a quantum dot photoluminescence material, a perovskite photoluminescence material, or a nanophosphor powder. When the blue light (450-455 nm) emitted by the blue micro LED chip is irradiated to the yellow light medium layer, light with a blue wavelength excites materials in the yellow light medium layer to emit light with different wavelengths, which is photoluminescence, emits white light (400-800 nm), and realizes conversion of the blue light to the white light.

Electroluminescence (EL) refers to a physical effect of directly conversion of electrical energy into light energy under the drive of an electric field. Photoluminescence (PL) refers to a process that a light-emitting substance radiates energy again in a form of photons or electromagnetic waves after absorbing energy of photons or electromagnetic waves.

In an embodiment, as shown in FIG. 1, The light-emitting medium layer 227 is formed on the substrate 221 and is provided on an entire surface. An arrangement of the entire surface of the light-emitting medium layer 227 ensures that the blue light emitted by the micro LED chip is converted to the white light when passing through the light-emitting medium layer 227, which prevents stray light from irradiating the liquid crystal display panel 100.

In another embodiment, the light-emitting medium layer 227 is formed between the substrate 221 and the first semiconductor layer 222, and is also provided on the entire surface.

In another embodiment, as shown in FIG. 2, the micro LED pixel array 220 includes a plurality of micro LED chips arranged in an array. Each of the plurality of micro LED chips includes a substrate 221, a first semiconductor layer 222, an active layer 223, a second semiconductor layer 224, a first electrode 225, and a second electrode 226. The substrate 221, the first semiconductor layer 222, the second semiconductor layer 224, the first electrode 225, and the second electrode 226 are similar to the embodiment shown in FIG. 1, and specific reference can be made to the above embodiment, which is not repeated herein.

Different from the above embodiment, in this embodiment, material of the active layer 223 is a multi-colored light-emitting mixed material. The active layer can be a single-layer structure in which different color light-emitting materials are mixed into one layer, can be a three-layer structure formed by vertically stacking a red light-emitting material, a green light-emitting material, and a blue light-emitting material, or can be a single-layer splicing structure formed by horizontally stacking the red light-emitting material, the green light-emitting material, and the blue light-emitting material, which is not limited herein.

Similarly, an N-type semiconductor layer 222, the active layer 223, and a P-type semiconductor layer 224 constitute a light-emitting PN junction. The P-type semiconductor layer 224 is electrically connected to the first electrode 225, and the N-type semiconductor layer 222 is electrically connected to the second electrode 226, so the second driving chip applying a voltage to the light-emitting PN junction is realized. When the second driving chip applies the voltage to the light-emitting PN junction, electrons are generated in the N-type semiconductor layer 222 and injected into the active layer 223, and holes are generated in the P-type semiconductor layer 224 and injected into the active layer 223. The electrons and the holes recombine in the active layer 223 to emit photons to realize conversion of electrical energy to light energy, thereby completing electroluminescence of the micro LED chip.

In a process of photoelectric conversion in the active layer 223, different color light-emitting materials realize different photoelectric conversion. Photons of different wavelengths are emitted, and these photons of different wavelengths are mixed to generate white light, thereby realizing that the micro LED chip emits the white light, and the micro LED display panel displays white color.

By controlling an external circuit and adjusting intensity of the electrical signals (including voltage, current, or power) applied to the micro LED chip, intensity of the electroluminescence of the micro LED chip and brightness of the white light displayed by the micro LED display panel can be controlled. Generally, the greater the intensity of the electric signals is, the greater intensity of the light-emitting of the electroluminescence of the micro LED chip is, and the brightness of the white light displayed by the micro LED display panel becomes greater as well. By adjusting a duration of the electrical signals applied to the micro LED chip, a length of time of electroluminescence of the micro LED chip and a length of time of the micro LED display panel displaying white light can be controlled. Generally, the longer the duration of the electrical signals is, the longer the length of time of electroluminescence of the micro LED chip is, and the length of time of the micro LED display panel displaying white light becomes longer as well.

By controlling the intensity and the time of the electrical signals applied to each micro LED chip, a precise control of each sub-pixel in the micro LED display panel can be realized, thereby controlling brightness and display time of the white color displayed by each sub-pixel.

In the present application, a size of a display region of the liquid crystal display panel 100 is same as a size of the display region of the micro LED display panel 200. The display region of the liquid crystal display panel 100 and the display region of the micro LED display panel 200 overlap each other in a space.

In an embodiment, as shown in FIG. 1, the liquid crystal display panel 100 and the micro LED display panel 200 are bonded together by a transparent adhesive layer 300. The transparent adhesive layer 300 is provided on an entire surface between the liquid crystal display panel 100 and the micro LED display panel 200, and light emitted by the micro LED display panel 200 needs to pass through the transparent adhesive layer 300 to reach the liquid crystal display panel 100, so the transparent adhesive layer 300 must adopt colorless transparent material. Preferably, the material of the transparent adhesive layer 300 is optically clear adhesive (OCA). The liquid crystal display panel 100 and the micro LED display panel 200 are bonded together by the transparent adhesive layer 300 provided on the entire surface, which is beneficial to a closer bonding of the liquid crystal display panel 100 and the micro LED display panel.

In another embodiment, as shown in FIG. 2, the liquid crystal display panel 100 and the micro LED display panel 200 are bonded together by a frame adhesive 400 in a non-display region around the liquid crystal display panel 100. Because the frame adhesive 400 is disposed in the non-display region around the liquid crystal display panel 100, there is no need to consider risks of blocking the light emitted by the micro LED display panel. Material of the frame adhesive 400 can be a colorless transparent material, a colored transparent material, or a non-transparent material. The material selection of the frame adhesive 400 is wider, correspondingly, materials with better bonding effect can be selected to ensure a bonding effect between the liquid crystal display panel 100 and the micro LED display panel and avoid peeling between the liquid crystal display panel 100 and the micro LED display panel; and materials with lower costs can also be selected to reduce manufacturing costs of the display module.

The display module provided by the present application removes the backlight module. The micro LED display panel 200 serves as a backlight of the liquid crystal display panel 100 and emits white light to the liquid crystal display panel 100 through pixels in the display panel emitting light. As shown in FIGS. 1 and 2, the liquid crystal display panel 100 includes pixel units arranged in an array, and each of the pixel units includes three first sub-pixels, namely a red sub-pixel, a green sub-pixel, and a blue sub-pixel. The micro LED display panel includes second sub-pixels arranged in an array.

In an embodiment, as shown in FIG. 1, the second sub-pixels and the first sub-pixels in the liquid crystal display panel 100 are in one-to-one correspondence. A size of each second sub-pixel is same as a size of a corresponding first sub-pixel, so light emitted by the second sub-pixels can conveniently provide a backlight for the corresponding first sub-pixel. By controlling a light-emitting display of the second sub-pixels in the micro LED display panel and intensity of white light irradiated to the corresponding first sub-pixel, backlight brightness required for each first sub-pixel in the liquid crystal display panel can be finely adjusted to realize a precise distinction of brightness. This one-to-one corresponding control method is extremely fine, which can significantly increase contrast of the double-layer display panel and increase its contrast value up to millionth level.

In another embodiment, the second sub-pixels and the pixel units in the liquid crystal display panel 100 are in one-to-one correspondence, that is, on micro LED chip corresponds to a group of a red sub-pixel, a green sub-pixel, and a blue sub-pixel. By controlling the light-emitting display of the second sub-pixels in the micro LED display panel, intensity of light irradiated to a corresponding pixel unit can be controlled, thereby realizing fine control of the backlight light. This one-to-three control method is also very fine, which can significantly increase contrast of the double-layer display panel and increase its contrast value up to millionth level. Compared with the embodiment shown in FIG. 1, one second sub-pixel corresponds to three first sub-pixels, and each pixel unit can save two micro LED chips, which reduces costs of products. A size of the micro LED chip can also be three times larger than that in the embodiment of FIG. 1, which reduces technical difficulty, increase yield, and further reduces production costs.

In another embodiment, the second sub-pixel can also correspond to two pixel units, three pixel units, or any other number of the pixel units, and can also correspond to two first sub-pixels, four first sub-pixels, or any other number of the first sub-pixels.

A size of the second sub-pixel ranges from 1 to 100 um, and the micro LED pixel array 220 can be bonded to the second array substrate 210 by a mass transfer process. The mass transfer process is a process of transferring a large number of the micro LED pixel array 220 onto the substrate at a time, and aims to increase yield of the micro LED pixel array 220. The mass transfer process can absorb the micro LED pixel array 220 and transfer it to the second array substrate 210 by vacuum adsorption, electrostatic adsorption, or magnetic adsorption.

In addition, the present application also provides a display device including a display module. The display module includes:

a liquid crystal display panel;

a micro light-emitting diode (LED) display panel disposed under the liquid crystal display panel and bonded to the liquid crystal display panel, wherein the micro LED display panel only displays white color;

a first driving chip connected to the liquid crystal display panel and configured to drive the liquid crystal display panel to emit light and display; and a second driving chip connected to the micro LED display panel and configured to drive the micro LED display panel to emit light and display.

This embodiment provides the display device including the display module. The display module adopts a double-layer panel design of bonding the liquid crystal display panel and the micro LED display panel, which removes a backlight module. The micro LED display panel serves as the backlight module and reduces power consumption of the display module. The micro LED display panel only displays white color. By controlling alight-emitting display of sub-pixels in the micro LED display panel, backlight brightness required for each pixel in the liquid crystal display panel can be finely adjusted to realize a precise distinction of brightness, thereby significantly increasing contrast of a double-layer display panel and increasing its contrast value to millionth level.

In an embodiment, the liquid crystal display panel includes pixel units arranged in an array, and each of the pixel units includes three first sub-pixels; and the micro LED display panel includes second sub-pixels arranged in an array.

In an embodiment, the second sub-pixels and the first sub-pixels are in one-to-one correspondence.

In an embodiment, the second sub-pixels and the pixel units are in one-to-one correspondence.

In an embodiment, a structure of bonding the liquid crystal display panel and the micro LED display panel includes bonding a lower surface of the liquid crystal display panel to an upper surface of the micro LED display panel by a transparent adhesive layer.

In an embodiment, a structure of bonding the liquid crystal display panel and the micro LED display panel includes using a frame adhesive in a non-display region around the liquid crystal display panel for bonding.

In an embodiment, the micro LED display panel includes a second array substrate and a micro LED pixel array bonded to the second array substrate.

In an embodiment, the micro LED pixel array includes a substrate, a first semiconductor layer, an active layer, a second semiconductor layer, a first electrode, and a second electrode.

In an embodiment, the micro LED pixel array further includes a light-emitting medium layer.

In an embodiment, material of the active layer includes multi-colored light-emitting mixed material.

According to the above embodiments, it can be known that:

The embodiments of the present application provide the display module and the display device. The display module adopts the double-layer panel design of bonding the liquid crystal display panel and the micro LED display panel, which removes the backlight module. The micro LED display panel serves as the backlight module and reduces power consumption of the display module. The micro LED display panel only displays white color. By controlling the light-emitting display of sub-pixels in the micro LED display panel, backlight brightness required for each pixel in the liquid crystal display panel can be finely adjusted to realize the precise distinction of the brightness, thereby significantly increasing contrast of the double-layer display panel and increasing its contrast value to millionth level.

Although the present application has been disclosed above with the preferred embodiments, it is not intended to limit the present application. Persons having ordinary skill in this technical field can still make various alterations and modifications without departing from the scope and spirit of this application. Therefore, the scope of the present application should be defined and protected by the following claims and their equivalents.

What is claimed is:

1. A display module, comprising:
    a liquid crystal display panel comprising pixel units arranged in an array, and each of the pixel units comprising three first sub-pixels;
    a micro light-emitting diode (LED) display panel disposed under the liquid crystal display panel and bonded to the liquid crystal display panel, wherein the micro LED display panel comprises second sub-pixels arranged in an array and only displays white color;
    a first driving chip connected to the liquid crystal display panel and configured to drive the liquid crystal display panel to emit light and display; and
    a second driving chip connected to the micro LED display panel and configured to drive the micro LED display panel to emit light and display;
    wherein the second sub-pixels and the first sub-pixels are in one-to-one correspondence.

2. The display module as claimed in claim 1, wherein a structure of bonding the liquid crystal display panel and the micro LED display panel comprises bonding a lower surface of the liquid crystal display panel to an upper surface of the micro LED display panel by a transparent adhesive layer.

3. The display module as claimed in claim 1, wherein a structure of bonding the liquid crystal display panel and the micro LED display panel comprises using a frame adhesive in a non-display region around the liquid crystal display panel for bonding.

4. The display module as claimed in claim 1, wherein the micro LED display panel comprises a second array substrate and a micro LED pixel array bonded to the second array substrate.

5. The display module as claimed in claim 4, wherein the micro LED pixel array comprises a substrate, a first semiconductor layer, an active layer, a second semiconductor layer, a first electrode, and a second electrode.

6. The display module as claimed in claim 5, wherein the micro LED pixel array further comprises a light-emitting medium layer.

7. The display module as claimed in claim 5, wherein material of the active layer comprises multi-colored light-emitting mixed material.

8. A display device, comprising a display module;
    wherein the display module comprises:
    a liquid crystal display panel comprising pixel units arranged in an array, and each of the pixel units comprising three first sub-pixels;
    a micro light-emitting diode (LED) display panel disposed under the liquid crystal display panel and bonded to the liquid crystal display panel, wherein the micro LED display panel comprises second sub-pixels arranged in an array and only displays white color;
    a first driving chip connected to the liquid crystal display panel and configured to drive the liquid crystal display panel to emit light and display; and
    a second driving chip connected to the micro LED display panel and configured to drive the micro LED display panel to emit light and display;
    wherein the second sub-pixels and the first sub-pixels are in one-to-one correspondence.

9. The display device as claimed in claim 8, wherein a structure of bonding the liquid crystal display panel and the micro LED display panel comprises bonding a lower surface of the liquid crystal display panel to an upper surface of the micro LED display panel by a transparent adhesive layer.

10. The display device as claimed in claim 8, wherein a structure of bonding the liquid crystal display panel and the micro LED display panel comprises using a frame adhesive in a non-display region around the liquid crystal display panel for bonding.

11. The display device as claimed in claim 8, wherein the micro LED display panel comprises a second array substrate and a micro LED pixel array bonded to the second array substrate.

12. The display device as claimed in claim 11, wherein the micro LED pixel array comprises a substrate, a first semiconductor layer, an active layer, a second semiconductor layer, a first electrode, and a second electrode.

13. The display device as claimed in claim 12, wherein the micro LED pixel array further comprises a light-emitting medium layer.

14. The display device as claimed in claim 12, wherein material of the active layer comprises multi-colored light-emitting mixed material.

* * * * *